United States Patent
Coimbra et al.

(10) Patent No.: US 9,467,107 B2
(45) Date of Patent: Oct. 11, 2016

(54) RAIL-TO-RAIL FOLLOWER CIRCUITS

(71) Applicant: Freescale Semiconductor, Inc., Austin, TX (US)

(72) Inventors: Ricardo P. Coimbra, Campinas (BR); Edevaldo Pereira Silva, Jr., Campinas (BR); Andre L. Couto, Sumare (BR)

(73) Assignee: Freescale Semiconductor, Inc., Austin, TX (US)

( * ) Notice: Subject to any disclaimer, the term of this patent is extended or adjusted under 35 U.S.C. 154(b) by 63 days.

(21) Appl. No.: 14/203,461

(22) Filed: Mar. 10, 2014

(65) Prior Publication Data

US 2015/0256135 A1    Sep. 10, 2015

(51) Int. Cl.
*H03F 3/45* (2006.01)
*H03F 1/42* (2006.01)
*H03F 3/30* (2006.01)
*H03F 3/50* (2006.01)

(52) U.S. Cl.
CPC .......... *H03F 3/3016* (2013.01); *H03F 3/4521* (2013.01); *H03F 3/505* (2013.01); *H03F 2200/513* (2013.01); *H03F 2200/69* (2013.01); *H03F 2203/30091* (2013.01); *H03F 2203/30123* (2013.01); *H03F 2203/45274* (2013.01)

(58) Field of Classification Search
USPC ................................................ 330/252–261
See application file for complete search history.

(56) References Cited

U.S. PATENT DOCUMENTS

| | | | |
|---|---|---|---|
| 5,646,576 A * | 7/1997 | Feldt et al. | .................... 330/263 |
| 7,208,974 B1 | 4/2007 | Chui | |
| 7,710,200 B2 | 5/2010 | Cho | |
| 7,764,123 B2 | 7/2010 | Kimura | |
| 2005/0030681 A1 | 2/2005 | Rosenthal | |
| 2008/0094126 A1 | 4/2008 | Yamazaki | |

FOREIGN PATENT DOCUMENTS

EP    1458091 B1    1/2007

OTHER PUBLICATIONS

Patt Boonyaporn and Varakom Kasemsuwan, "A High Performance Class AB CMOS Rail to Rail Voltage Follower"—2002 IEEE Asia-Pacific Conference on ASIC Proceedings, 2002, pp. 161-163.

* cited by examiner

*Primary Examiner* — Hieu Nguyen

(57) ABSTRACT

In some embodiments, a source follower circuit may include a first level shifter configured to receive an input voltage; an N-type Metal-Oxide-Semiconductor (NMOS) transistor having a gate terminal coupled to an output of the first level shifter; a second level shifter configured to receive the input voltage; a P-type Metal-Oxide-Semiconductor (PMOS) transistor having a gate terminal coupled to an output of the second level shifter and a source terminal coupled to a source terminal of the NMOS transistor; and an amplifier configured to receive the input voltage and to output a current at a node between the source terminal of the NMOS transistor and the source terminal of the PMOS transistor, wherein the current is determined based upon a difference between the input voltage and a reference voltage.

20 Claims, 6 Drawing Sheets

RAIL-TO-RAIL FOLLOWER CIRCUITS

FIELD

This disclosure relates generally to electronic circuits, and more specifically, to rail-to-rail follower circuits.

BACKGROUND

A common-drain amplifier, also known as a "source follower," is a single-stage Field Effect Transistor (FET) amplifier topology commonly used in analog Integrated Circuit (IC) design. In many circuits, source followers may be employed as voltage buffers. Additionally or alternatively, source followers may also be used to transform impedances. For example, when a voltage follower is driven by a voltage source having high output impedance, the output impedance of the combination is equal to the output impedance of the voltage follower only, which is relatively small.

The inventors hereof have recognized, however, that conventional source followers have certain shortcomings. For example, a traditional source follower only supports output excursion to one of the supply rails—to the lower supply rail if N-type or to upper supply rail if P-Type. Previous attempts to implement source followers with rail-to-rail excursion disadvantageously involve reducing bandwidth and/or otherwise degrading transient performance of the circuit.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

A single stage amplifier structure commonly referred to as a "source follower" and/or "common-drain amplifier" is a basic circuit building block used extensively in analog Integrated Circuit (IC) design. Source followers are commonly found in various different applications and may be used, for example, as voltage buffers or to transform impedances.

Generally speaking, a conventional source follower circuit only supports output excursion to one of the voltage supply rails—to the lower voltage rail if configured as an N-type source follower or to the upper voltage rail if configured as a P-type source follower. To address these, and other shortcomings of conventional source follower circuits, the inventors hereof have developed novel source follower circuits that are configured to provide rail-to-rail capability with certain performance advantages. For example, in some cases, a rail-to-rail follower circuit as described herein may be employed within a Low-Dropout Regulator (LDO) to drive a pass-device and to thereby reduce its circuit footprint.

Embodiments of rail-to-rail follower circuits as described herein may automatically configure themselves as N-type source followers when their output levels approach the lower supply rail and may automatically reconfigure themselves as P-type source followers when their output levels approach the upper supply rail, while resembling PN-type followers in the mid-voltage range. As the output level varies, a rail-to-rail follower circuit may transition between its various configurations in a smooth and continuous manner maintaining a stable output impedance over the excursion range. Therefore, these rail-to-rail follower circuits do not present the drawbacks related to switching techniques that show undesirable non-linear behavior around the switching region.

In addition, certain implementations may be based on an open-loop structure operating in current mode with no internal high-impedance nodes to achieve AC behavior equivalent to the basic follower stages. As such, these rail-to-rail follower circuits may provide the performance characteristics of a basic follower stage (e.g., AC bandwidth, transient behavior, etc.) while supporting rail-to-rail output excursion.

Figure 1:
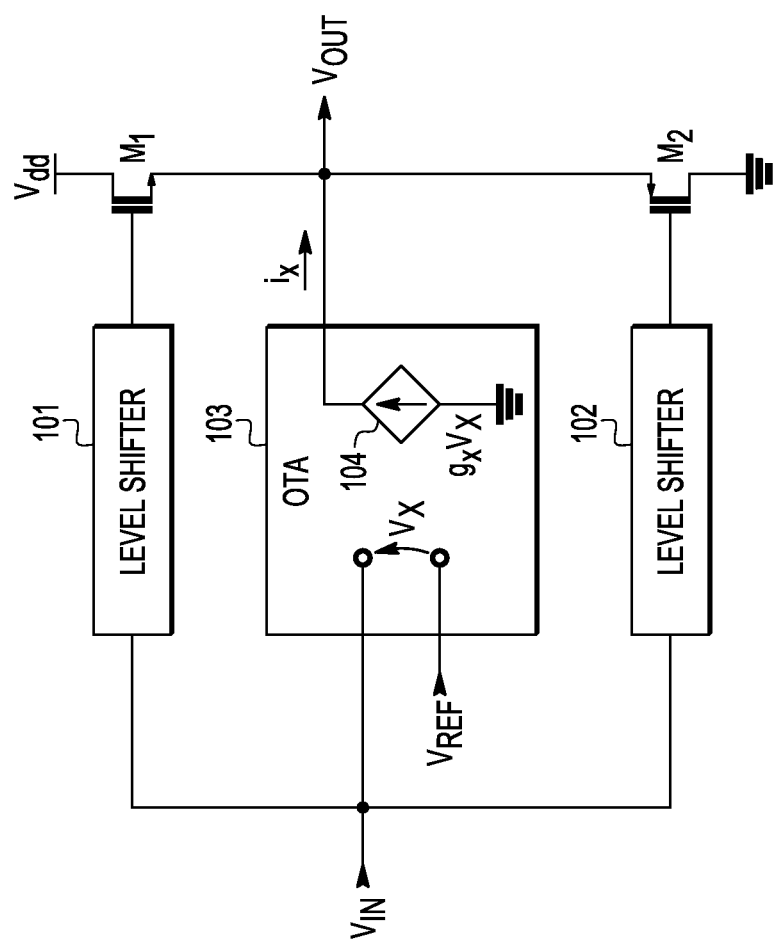
FIG. 1 is a block diagram of an example of a rail-to-rail follower circuit according to some embodiments.

Turning to FIG. 1, a block diagram of an example of a rail-to-rail follower circuit is depicted. Particularly, N-type metal-oxide-semiconductor (NMOS) transistor M1 has its drain terminal coupled to $V_{dd}$ and its source terminal coupled to the source terminal of P-type MOS (PMOS) transistor M2. Also, PMOS transistor $M_2$ has its drain terminal coupled to ground or another suitable reference node. The output of source follower 100, here shown as $V_{OUT}$, is provided at a node between the source terminals of M1 and M2.

Input voltage $V_{IN}$ is coupled to first level shifter 101, to second level shifter 102, and to Operational Transconductance Amplifier (OTA) 103. The output of first level shifter 101 is coupled to the gate terminal of $M_1$, and the output of second level shifter 102 is coupled to the gate terminal of $M_2$. Also, the output of OTA 103 is coupled to $V_{OUT}$.

In operation, OTA 103 is configured to receive reference voltage $V_{REF}$, compare $V_{IN}$ with $V_{REF}$, determine a difference $V_x$ between $V_{IN}$ and $V_{REF}$, and output current $i_x$. In some implementations, output current $i_x$ may be proportional to $V_x$ provided by current source 104. Specifically, the value of $i_x$ may be given by $g_x V_x$, where $g_x$ is the electrical conductance of current source 104. More generally, however, $g_x$ may be made to change with $V_x$ to smoothen the effects of the transition.

When $V_{IN}$ is equal to $V_{REF}$, OTA 103 delivers zero current $i_x$ and level shifters 101 and 102 bias output branch transistors M1 and M2, respectively, obtaining an $I_Q$ quiescent current and thus resulting in PN-type follower configuration.

As $V_{IN}$ rises above $V_{REF}$, OTA 103 sources an increasing current $i_x$ up to the maximum $I_{LIM}$ value. From around that point forward, level-shifter 101 is allowed to saturate (its output may be clamped) cutting-off transistor M1 with no reduction in the maximum output impedance, and thus resulting in a P-type follower configuration. Conversely, as $V_{IN}$ falls below $V_{REF}$, OTA 103 drains an increasing current up to the maximum $I_{LIM}$ value. From that point forward, level-shifter 102 is allowed to saturate cutting-off transistor M2, again with no compromise as to the maximum output impedance, thus resulting in an N-type follower configuration.

In some embodiments, by making $I_{LIM}=4 \cdot I_Q$ and by matching the transconductances of M1 and M2, the output impedance of circuit 100 is matched for all of the foregoing three circuit configurations with a continuous and smooth profile in the transition regions. The gain of OTA 103 ($g_x$) and $V_{REF}$ may be adjusted to best fit the transition profiles within a given range of output voltage excursion. Also, in various implementations, $V_{REF}$ may be equal to a halfway point between the upper and lower rails.

Again, source follower circuit 100 automatically self-configures as a P-Type source follower when the output moves towards the upper rail and as a N-type source follower when the output moves towards the lower rail. In a mid-point of the excursion range, the circuit configuration resembles a PN-type source follower.

Figure 2:
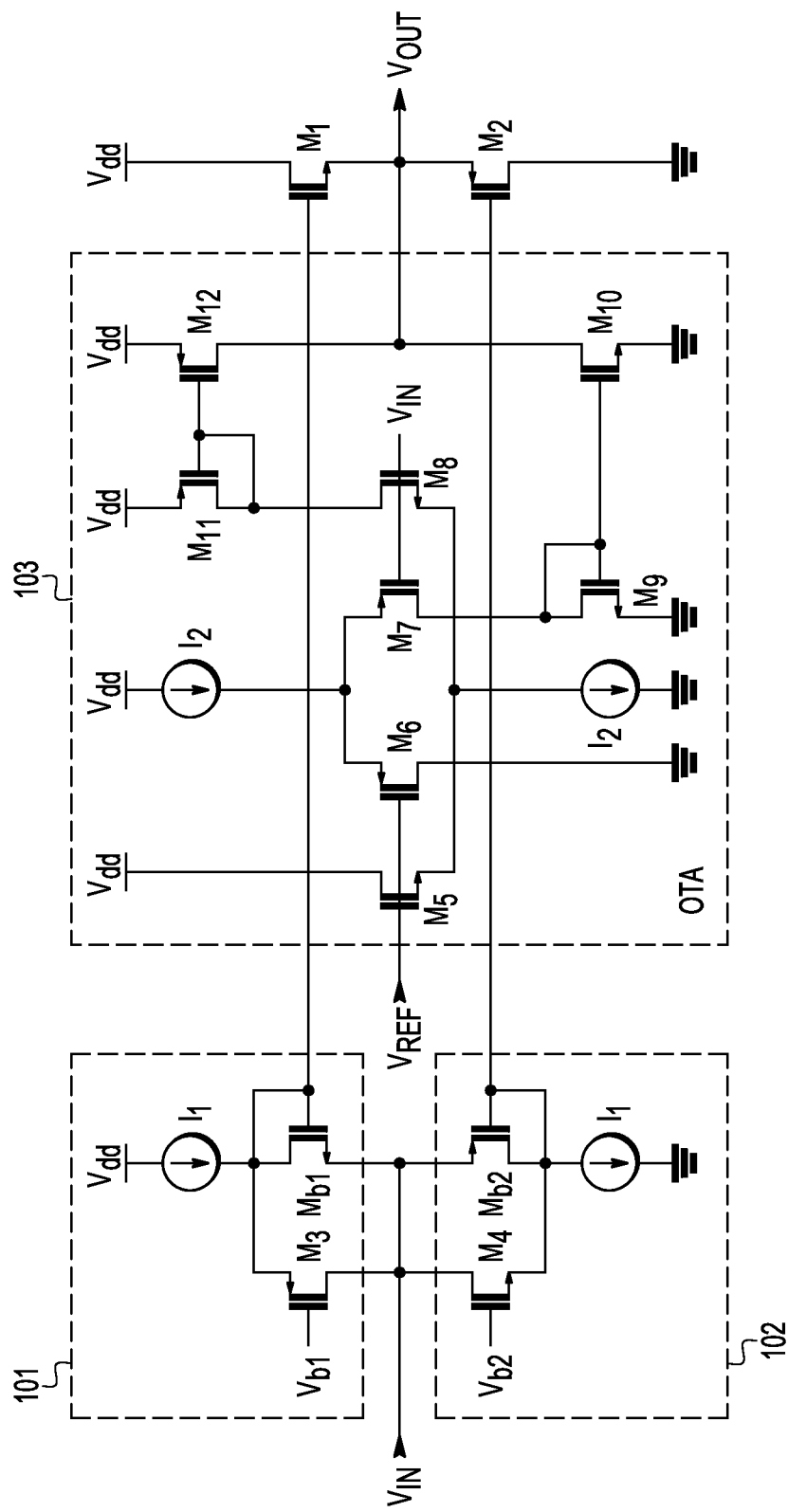
FIG. 2 is a circuit diagram of an example of a rail-to-rail follower circuit according to some embodiments.

FIG. 2 is a circuit diagram of an example of rail-to-rail follower circuit 200 according to some embodiments. In this implementation, first level shifter 101 includes current source $I_1$ coupled to $V_{dd}$ and to the source terminal of transistor M3 (PMOS) and the drain and gate terminals of transistor Mb1 (NMOS). The drain terminal of M3 and the source terminal of Mb1 are coupled to the drain of transistors M4 (NMOS) and the source of transistor Mb2 (PMOS), which along with another current source I1 form second level shifter 102. Transistor M3 is biased by $V_{b1}$, and transistor M4 is biased by $V_{b2}$. $V_{IN}$ is provided at the nodes between transistors M3 and M4 and between Mb1 and Mb2.

OTA 103 includes transistors M5, M8, M9, and M10 (NMOS) and transistors M6, M7, M11, and M12 (PMOS), configured with current source(s) I2 as shown. In this case, limit value $I_{LIM}$ is proportional to tail current I2. The gates of M5 and M8 are configured to receive $V_{REF}$ and $V_{IN}$, respectively. The output $V_{OUT}$ of OTA 103 is provided between M1 and M2, as originally shown in FIG. 1.

Figure 3:
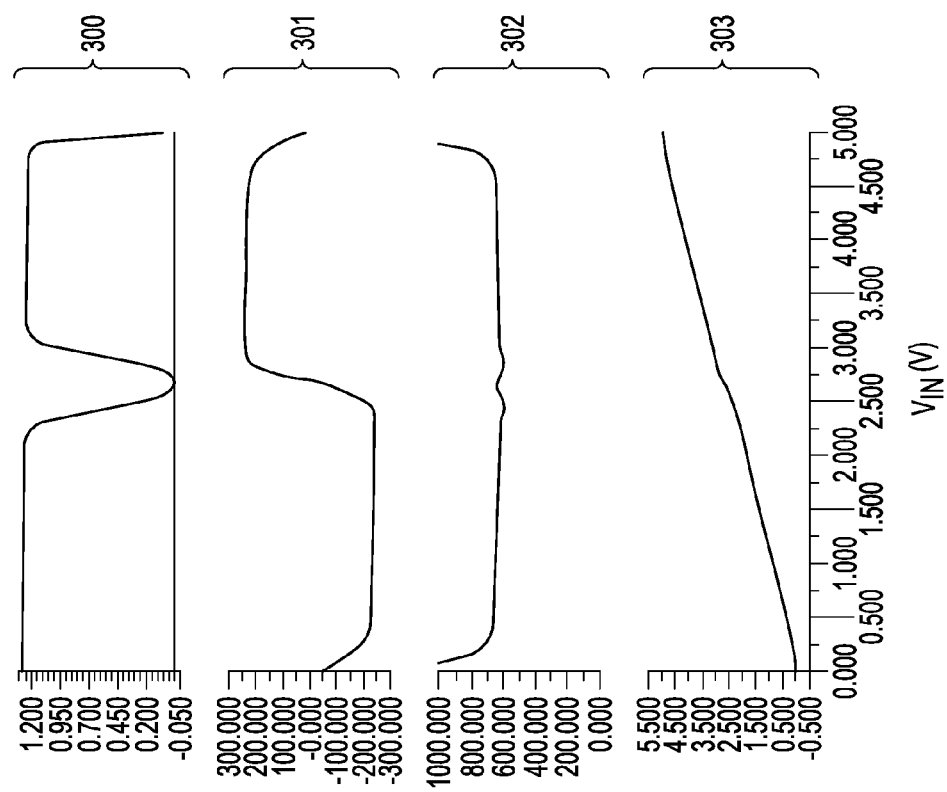
FIG. 3 shows graphs illustrating operation of a rail-to-rail follower circuit according to some embodiments.

FIG. 3 shows graphs illustrating operation of rail-to-rail follower circuit 200 according to some embodiments. In this example, $V_{IN}$ and $V_{OUT}$ vary from 0 V (lower rail) to 5 V (upper rail), a shown in curve 303. Particularly, curve 300 shows the drain current through transistor M4 as it dips from approximately 1.2 µA to approximately zero (to the right of the trough) and the source current through M3 as it increases from approximately zero to approximately 1.2 µA (to the left of the trough) as a function of $V_{IN}$. With respect to curve 300, circuit 200 operates to the left of the trough as an N-type source follower, to the right of the trough as a P-type source follower, in the trough region as a PN-type source follower.

Curve 301 shows the value of $I_x$ as it increases from approximately −200 µA to approximately 200 µA when $V_{IN}$ increases from 0 to 5 V. During the first half of $V_{IN}$'s excursion, $I_x$ has a negative value and during the second half of $V_{IN}$'S excursion $I_x$ has a positive value. Curve 302 shows the impedance presented at the output of circuit 200 as a function of $V_{IN}$, and it may be noted that it remains approximately constant throughout the entire range of operation.

Figure 4:
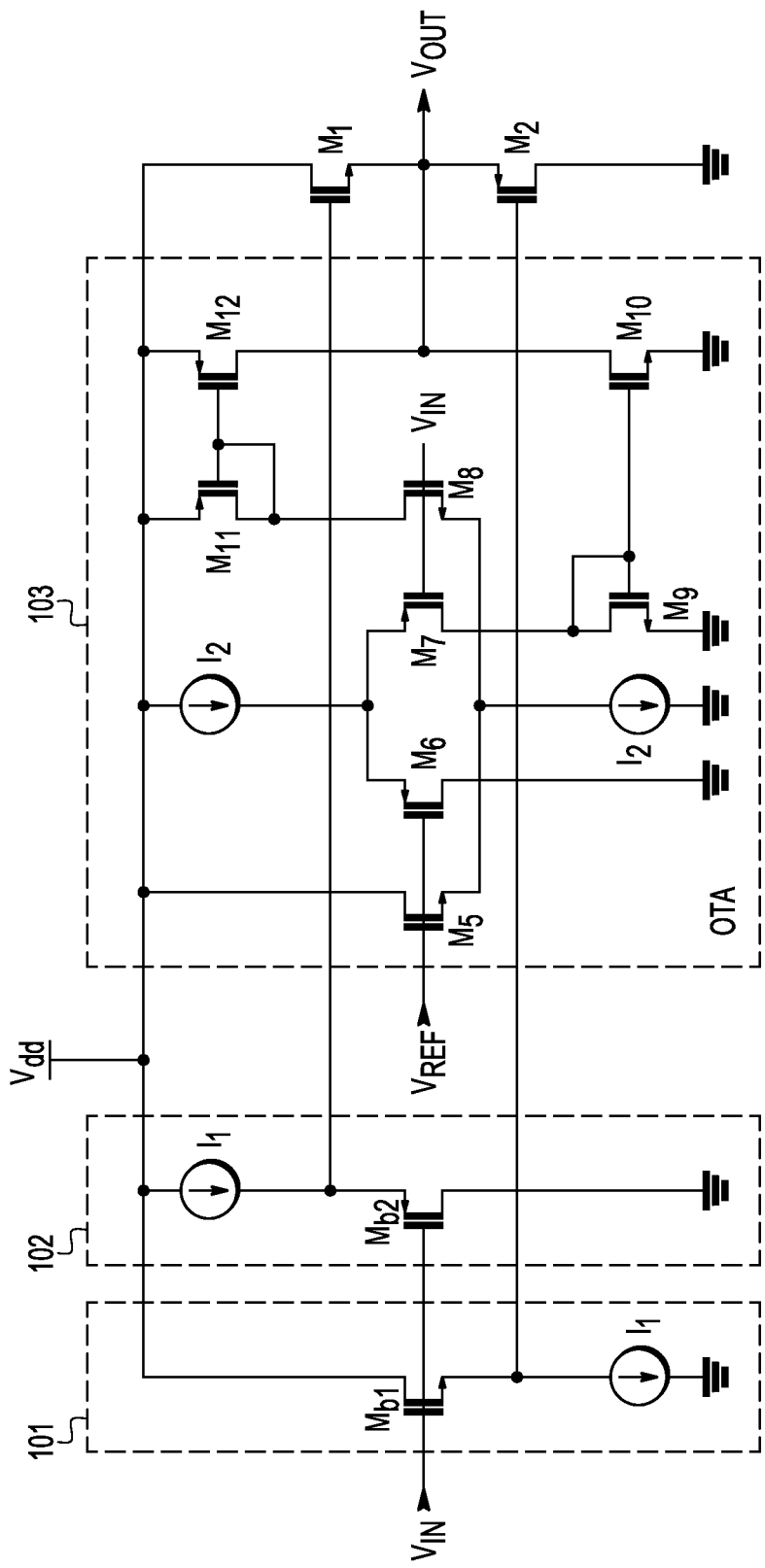
FIG. 4 is a circuit diagram of another example of a rail-to-rail follower circuit according to some embodiments.

FIG. 4 is a circuit diagram of another example of a rail-to-rail follower circuit according to some embodiments. In this implementation, second level shifter 102 includes transistor Mb1 (NMOS) having its drain terminal coupled to $V_{dd}$ and its source terminal coupled to current source I1. First level shifter 101 includes transistor Mb2 (PMOS) having its source terminal coupled to current source I1 and its drain terminal coupled to ground. Input voltage $V_{IN}$ is coupled to the gate terminals of Mb1 and Mb2, which provide an additional decoupling stage.

OTA 103 includes transistors M5, M8, M9 and M10 (NMOS) as well as transistors M6, M7, M11, and M12 (PMOS) configured as shown. $I_{LIM}$ is proportional to I2. $V_{REF}$ is provided at the gate terminals of M5 and M6, $V_{IN}$ is provided at the gate terminals of M7 and M8, $V_{OUT}$ is provided at the node between the source terminals of M1 and M2.

Figure 5:
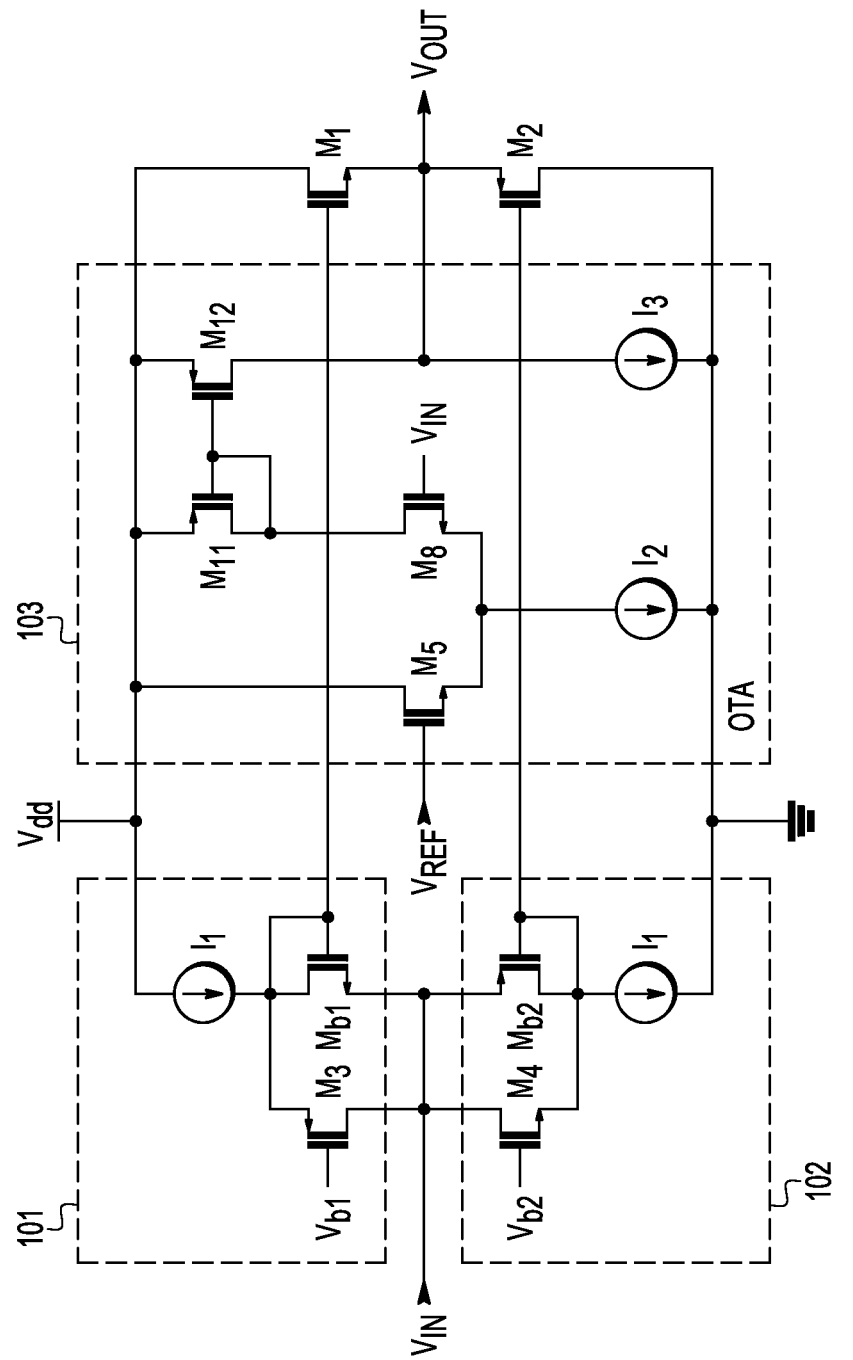
FIG. 5 is a circuit diagram of yet another example of a rail-to-rail follower circuit according to some embodiments.

FIG. 5 is a circuit diagram of yet another example of a rail-to-rail follower circuit according to some embodiments. In this implementation, first level shifter 101 includes transistor M3 (PMOS) and Mb1 (NMOS) coupled to current source I1. Second level shifter 102 includes transistor M4 (NMOS) and Mb2 (PMOS) coupled to current source I1. $V_{IN}$ is coupled at the nodes between M3 and M4 and between Mb1 and Mb2.

OTA 103 includes transistors M5 and M8 (NMOS) as well as M11 and M12 (PMOS) in the configuration shown. $V_{REF}$ is provided at the gate terminal of M5 and $V_{IN}$ is provided at the gate of M8. The source terminals of M5 and M8 are coupled to current source I2, and the drain terminal of M12 is coupled to current source I3. In this example, the value of Ix is allowed to vary between −I3 and (k*I2−I3), where k is the M11-M12 mirror gain.

In many implementations, the systems and methods disclosed herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Figure 6:
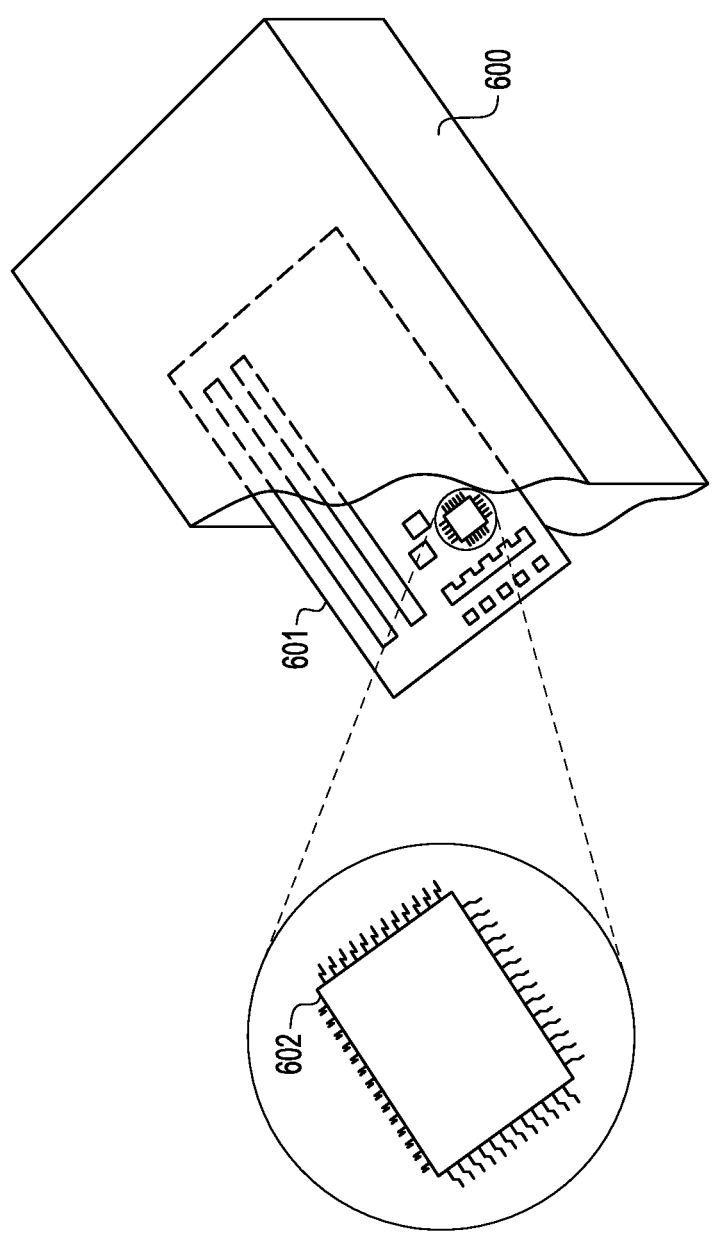
FIG. 6 is a diagram of an example of an electronic system having one or more electronic microelectronic device packages according to some embodiments.

Turning to FIG. 6, a block diagram of electronic system 600 is depicted. In some embodiments, electronic system 600 may include of the aforementioned electronic devices, or any other electronic device. As illustrated, electronic system 600 includes one or more Printed Circuit Boards (PCBs) 601, and at least one of PCBs 601 includes one or more microelectronic device packages(s) 602. In some implementations, device package(s) 602 may include one or more circuits having a rail-to-rail source follower as discussed above.

Examples of device package(s) 602 may include, for instance, a System-On-Chip (SoC), an Application Specific Integrated Circuit (ASIC), a Digital Signal Processor (DSP), a Field-Programmable Gate Array (FPGA), a processor, a microprocessor, a controller, a microcontroller (MCU), a Graphics Processing Unit (GPU), or the like. Additionally or alternatively, device package(s) 502 may include a memory circuit or device such as, for example, a Random Access Memory (RAM), a Static RAM (SRAM), a Magnetoresistive RAM (MRAM), a Nonvolatile RAM (NVRAM, such as "FLASH" memory, etc.), and/or a Dynamic RAM (DRAM) such as Synchronous DRAM (SDRAM), a Double Data Rate RAM, an Erasable Programmable ROM (EPROM), an Electrically Erasable Programmable ROM (EEPROM), etc. Additionally or alternatively, device package(s) 602 may include one or more mixed-signal or analog circuits, such as, for example, Analog-to-Digital Converter (ADCs), Digitalto-Analog Converter (DACs), Phased Locked Loop (PLLs), oscillators, filters, amplifiers, etc. Additionally or alternatively, device package(s) 602 may include one or more Micro-ElectroMechanical Systems (MEMS), Nano-Electro-Mechanical Systems (NEMS), or the like.

Generally speaking, device package(s) 602 may be configured to be mounted onto PCB 601 using any suitable packaging technology such as, for example, Ball Grid Array (BGA) packaging or the like. In some applications, PCB 601 may be mechanically mounted within or fastened onto electronic device 600. It should be noted that, in certain implementations, PCB 601 may take a variety of forms and/or may include a plurality of other elements or components in addition to device package(s) 602. It should also be noted that, in some embodiments, PCB 601 may not be used and/or device package(s) 602 may assume any other suitable form(s).

As described above, in an illustrative, non-limiting embodiment, a source follower circuit includes a first level shifter configured to receive an input voltage; an N-type Metal-Oxide-Semiconductor (NMOS) transistor having a gate terminal coupled to an output of the first level shifter; a second level shifter configured to receive the input voltage; a P-type Metal-Oxide-Semiconductor (PMOS) transistor having a gate terminal coupled to an output of the second level shifter and a source terminal coupled to a source terminal of the NMOS transistor; and an amplifier configured to receive the input voltage and to output a current at a node between the source terminal of the NMOS transistor and the source terminal of the PMOS transistor, wherein the current is determined based upon a difference between the input voltage and a reference voltage.

In some implementations, the amplifier may be configured to increase the current in response to the input voltage approaching an upper voltage threshold. The current may be configured to increase up to a maximum value. The maximum value may have a modulus approximately equal to four times a value of a quiescent current through the NMOS or PMOS transistors. The current may be configured to make the NMOS transistor non-conductive as it approaches the maximum value. The amplifier may be configured to decrease the current in response to the input voltage approaching a lower voltage threshold.

In addition, the current may be configured to decrease to a minimum value. The minimum value may have a modulus approximately equal to four times a value of a quiescent current through the NMOS or PMOS transistors. The current may be further configured to make the PMOS transistor non-conductive as it approaches the minimum value.

In another illustrative, non-limiting embodiment, an electronic device may include a rail-to-rail source follower circuit including an amplifier configured to receive an input voltage and to output a current at a node between a source terminal of an NMOS transistor and a source terminal of a PMOS transistor, where the input voltage is configured to drive a gate terminal of the NMOS transistor and a gate terminal of the PMOS transistor, where the output current is proportional to a difference between the input voltage and a reference voltage, where the output current is configured to make the NMOS transistor non-conductive as the input voltage approaches an upper threshold, and where the output current is configured to make the PMOS transistor non-conductive as the input voltage approaches a lower threshold.

For example, the output current may be configured to increase up to a maximum value as the input voltage approaches the upper threshold. The maximum value may have a modulus approximately equal to four times a value of a quiescent current through the NMOS or PMOS transistors. The output current may be configured to decrease to a minimum value. The minimum value may have a modulus approximately equal to four times a value of a quiescent current through the NMOS or PMOS transistors.

In yet another illustrative, non-limiting embodiment, a method may include receiving an input voltage at an amplifier of a source follower circuit having an NMOS transistor and a PMOS transistor, where the input voltage is configured to drive a gate terminal of the NMOS transistor and a gate terminal of the PMOS transistor, and where a source terminal of the NMOS transistor is coupled to a source terminal of the PMOS transistor; determining, by the amplifier, a difference between the input voltage and a reference voltage; and outputting, by the amplifier at a node between the source terminal of the NMOS transistor and the source terminal of the PMOS transistor, a current proportional to the difference.

The method may also include varying the input voltage over time between an upper threshold and a lower threshold, where the reference voltage has a fixed value between the upper threshold and the lower threshold. The method may further include increasing the output current up to a maximum value by the amplifier to make the NMOS transistor non-conductive in response to the input voltage reaching the upper voltage threshold. For example, the maximum value may have a modulus approximately equal to four times a value of a quiescent current through the NMOS or PMOS transistors. Additionally or alternatively, the method may include decreasing the current down to a minimum value by the amplifier to make the PMOS transistor non-conductive in response to the input voltage approaching the lower voltage threshold. For example, the minimum value may have a modulus approximately equal to four times a value of a quiescent current through the NMOS or PMOS transistors.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The term "coupled" is defined as connected, although not necessarily directly, and not necessarily mechanically. The terms "a" and "an" are defined as one or more unless stated otherwise. The terms "comprise" and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A source follower circuit, comprising:
   a first level shifter configured to receive an input voltage;
   an N-type Metal-Oxide-Semiconductor (NMOS) transistor having a gate terminal coupled to an output of the first level shifter;
   a second level shifter configured to receive the input voltage;
   a P-type Metal-Oxide-Semiconductor (PMOS) transistor having a gate terminal coupled to an output of the second level shifter and a source terminal coupled to a source terminal of the NMOS transistor; and
   an amplifier configured to receive the input voltage and to produce an output current at a node between the source terminal of the NMOS transistor and the source terminal of the PMOS transistor, wherein the output current is determined without switching and based upon a difference between the input voltage and a single reference voltage.

2. The source follower circuit of claim 1, wherein the amplifier is configured to increase the output current in response to the input voltage rising above the single reference voltage and approaching an upper voltage threshold.

3. The source follower circuit of claim 2, wherein at a first time the output current increases up to a maximum value.

4. The source follower circuit of claim 3, wherein the maximum value has a modulus approximately equal to four times a value of a quiescent current through the NMOS or PMOS transistors.

5. The source follower circuit of claim 3, wherein the output current makes the NMOS transistor non-conductive as it approaches the maximum value.

6. The source follower circuit of claim 5, wherein the amplifier is configured to decrease the output current in response to the input voltage falling below the single reference voltage and approaching a lower voltage threshold.

7. The source follower circuit of claim 6, wherein at a second time the output current decreases to a minimum value.

8. The source follower circuit of claim 7, wherein the minimum value has a modulus approximately equal to four times a value of a quiescent current through the NMOS or PMOS transistors.

9. The source follower circuit of claim 7, wherein the output current makes the PMOS transistor non-conductive as it approaches the minimum value.

10. An electronic device, comprising:
    a rail-to-rail source follower circuit including an amplifier configured to receive an input voltage and to output a current at a node between a source terminal of an N-type Metal-Oxide-Semiconductor (NMOS) transistor and a source terminal of a P-type Metal-Oxide-Semiconductor (PMOS) transistor without switching, wherein the input voltage is configured to drive a gate terminal of the NMOS transistor and a gate terminal of the PMOS transistor, wherein the output current is proportional to a difference between the input voltage and a single reference voltage, wherein the output current makes the NMOS transistor non-conductive as the input voltage approaches an upper threshold, and wherein the output current makes the PMOS transistor non-conductive as the input voltage approaches a lower threshold.

11. The electronic device of claim 10, wherein the output current increases up to a maximum value as the input voltage approaches the upper threshold.

12. The electronic device of claim 11, wherein the maximum value has a modulus approximately equal to four times a value of a quiescent current through the NMOS or PMOS transistors.

13. The electronic device of claim 11, wherein the output current to decreases to a minimum value as the input voltage approaches the lower threshold.

14. The electronic device of claim 13, wherein the minimum value has a modulus approximately equal to four times a value of a quiescent current through the NMOS or PMOS transistors.

15. A method, comprising:
    receiving an input voltage at an amplifier of a source follower circuit having an N-type Metal-Oxide-Semiconductor (NMOS) transistor and a P-type Metal-Oxide-Semiconductor (PMOS) transistor, wherein the input voltage is configured to drive a gate terminal of the NMOS transistor and a gate terminal of the PMOS transistor, and wherein a source terminal of the NMOS transistor is coupled to a source terminal of the PMOS transistor;
    determining, by the amplifier without switching, a difference between the input voltage and a single reference voltage; and
    outputting, by the amplifier at a node between the source terminal of the NMOS transistor and the source terminal of the PMOS transistor, a current proportional to the difference.

16. The method of claim 15, further comprising varying the input voltage over time between an upper threshold and a lower threshold, wherein the single reference voltage has a fixed value between the upper threshold and the lower threshold.

17. The method of claim 16, further comprising increasing the output current up to a maximum value by the amplifier to make the NMOS transistor non-conductive in response to the input voltage reaching the upper voltage threshold.

18. The method of claim 17, wherein the maximum value has a modulus approximately equal to four times a value of a quiescent current through the NMOS or PMOS transistors.

19. The method of claim 17, further comprising decreasing the current down to a minimum value by the amplifier to make the PMOS transistor non-conductive in response to the input voltage approaching the lower voltage threshold.

20. The method of claim 19, wherein the minimum value has a modulus approximately equal to four times a value of a quiescent current through the NMOS or PMOS transistors.

* * * * *